United States Patent
Irizawa et al.

(10) Patent No.: US 12,509,615 B2
(45) Date of Patent: Dec. 30, 2025

(54) SUBSTRATE-CONVEYING SUPPORT TAPE AND ELECTRONIC APPARATUS/DEVICE PRODUCTION METHOD

(71) Applicant: Showa Denko Materials Co., Ltd., Tokyo (JP)

(72) Inventors: Shinji Irizawa, Tokyo (JP); Shogo Sobue, Tokyo (JP); Mika Tanaka, Tokyo (JP); Saeko Ogawa, Tokyo (JP)

( * ) Notice: Subject to any disclaimer, the term of this patent is extended or adjusted under 35 U.S.C. 154(b) by 800 days.

(21) Appl. No.: 17/770,628

(22) PCT Filed: Oct. 29, 2020

(86) PCT No.: PCT/JP2020/040659
§ 371 (c)(1),
(2) Date: Apr. 21, 2022

(87) PCT Pub. No.: WO2021/085539
PCT Pub. Date: May 6, 2021

(65) Prior Publication Data
US 2023/0039482 A1    Feb. 9, 2023

(30) Foreign Application Priority Data
Oct. 31, 2019    (JP) .................................. 2019-198430

(51) Int. Cl.
*C09J 7/38*    (2018.01)
*B32B 25/08*    (2006.01)
(Continued)

(52) U.S. Cl.
CPC ............... *C09J 7/385* (2018.01); *B32B 25/08* (2013.01); *B32B 25/14* (2013.01); *B32B 27/08* (2013.01); *B32B 27/281* (2013.01); *B32B 27/38* (2013.01); *B32B 37/025* (2013.01); *B32B 37/26* (2013.01); *C09J 7/29* (2018.01); *H01L 21/568* (2013.01);
(Continued)

(58) Field of Classification Search
CPC combination set(s) only.
See application file for complete search history.

(56) References Cited

U.S. PATENT DOCUMENTS 5,527,621 A * 6/1996 Matsuura ............ B32B 38/0036
427/322

FOREIGN PATENT DOCUMENTS

JP    4565804    10/2010
JP    4936667    5/2012
(Continued)

OTHER PUBLICATIONS

International Search Report dated Jan. 19, 2021 for PCT/JP2020/040659.
(Continued)

*Primary Examiner* — Ramsey Zacharia
(74) *Attorney, Agent, or Firm* — SHIPWAY IP

(57) ABSTRACT

A substrate-conveying support tape includes: a support film; a primer layer provided on the support film; and a temporary fixing material layer provided on the primer layer, in which the support film is a polyimide film, the temporary fixing material layer contains a thermoplastic resin, and the primer layer contains at least one selected from the group consisting of a silane coupling agent having an epoxy group or a ureido group, an epoxy resin, a polyurethane rubber, and an acrylic rubber having an acid value of 5 mgKOH/g or more.

16 Claims, 4 Drawing Sheets

(51) Int. Cl.
*B32B 25/14* (2006.01)
*B32B 27/08* (2006.01)
*B32B 27/28* (2006.01)
*B32B 27/38* (2006.01)
*B32B 37/00* (2006.01)
*B32B 37/26* (2006.01)
*C09J 7/29* (2018.01)
*H01L 21/56* (2006.01)
*H01L 21/683* (2006.01)

(52) U.S. Cl.
CPC .... *H01L 21/6836* (2013.01); *B32B 2307/308* (2013.01); *B32B 2307/748* (2013.01); *B32B 2405/00* (2013.01); *B32B 2457/14* (2013.01); *C09J 2463/006* (2013.01); *C09J 2475/006* (2013.01); *C09J 2479/086* (2013.01)

(56) References Cited

FOREIGN PATENT DOCUMENTS

| | | |
|---|---|---|
| JP | 2014-201657 | 10/2014 |
| JP | 2016-216572 | 12/2016 |
| JP | 2017-204612 | 11/2017 |
| TW | 201900801 | 1/2019 |

OTHER PUBLICATIONS

International Preliminary Report on Patentability with Written Opinion dated May 12, 2022 for PCT/JP2020/040659.

\* cited by examiner (A)

(B)

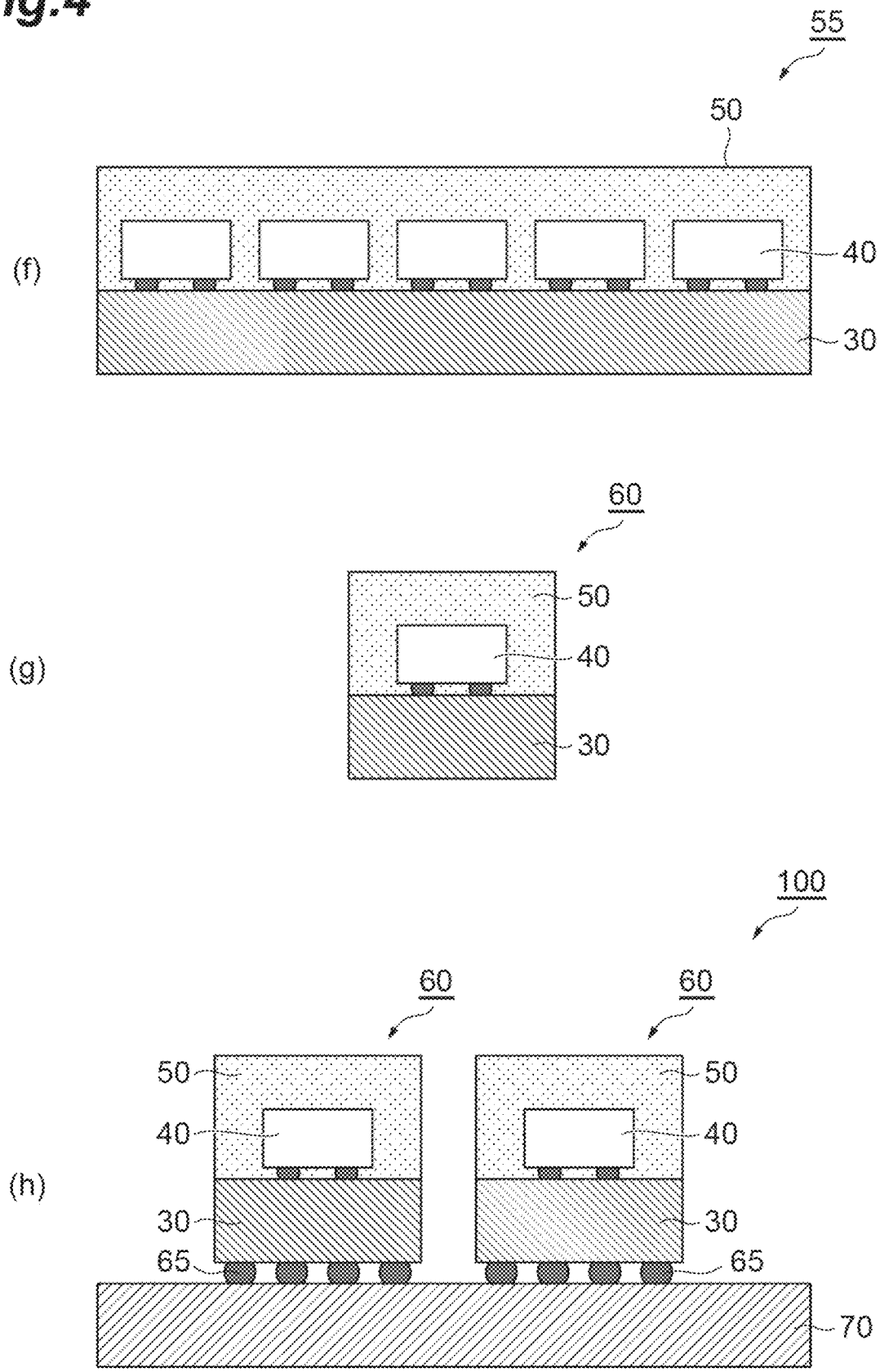

SUBSTRATE-CONVEYING SUPPORT TAPE AND ELECTRONIC APPARATUS/DEVICE PRODUCTION METHOD

CROSS-REFERENCE TO RELATED APPLICATIONS

This application is a 35 U.S.C. § 371 national phase application of PCT/JP2020/040659, filed on Oct. 29, 2020, which claims priority to Japanese Patent Application No. 2019-198430, filed on Oct. 31, 2019.

TECHNICAL FIELD

The present invention relates to a substrate-conveying support tape and a method for producing an electronic device.

BACKGROUND ART

A stacked MCP (Multi Chip Package) obtained by stacking semiconductor elements in multiple stages so as to have a high capacity has become widespread in association with the multi-functionalization of electronic devices such as a smartphone and a tablet PC. A film-shaped adhesive is widely used as an adhesive for die bonding in the mounting of the semiconductor element. However, since the processing speed of data is limited by the connection method of the semiconductor element using the current wire bond, the operation of the electronic devices tends to be slower. Furthermore, power saving is also being desired since there is a growing need to use the electronic devices for a long time without charging them while keeping the power consumption low. From such viewpoints, in recent years, electronic devices having a new structure in which the semiconductor elements are connected to one another not by the wire bond but by a through electrode for the purpose of further increasing the speed and saving the power have also been developed.

High capacity is still desired although electronic devices having a new structure have been developed in this manner, and the development of a technique that is able to stack semiconductor elements in more multiple stages has been promoted regardless of the package structure. However, stable thinning of the semiconductor element is essential in order to stack a greater number of semiconductor elements in a limited space.

For example, thickness reduction has been achieved by grinding a semiconductor wafer from the back surface side. In the grinding step at this time, it has become the mainstream to perform the grinding step in a state of the semiconductor wafer being supported by pasting a tape, so-called BG tape (back grinding tape) to the semiconductor wafer. However, in the semiconductor wafer to be subjected to the grinding step, a circuit is formed on the surface side, and when the semiconductor wafer is thinned by grinding, warpage is likely to occur due to the influence thereof. Since the BG tape is a deformable tape material, the BG tape cannot sufficiently support the thinned semiconductor wafer, and the semiconductor wafer is likely to warp. In this regard, a method of fixing a wafer to a support by means of a pressure sensitive adhesive and subjecting the wafer to back surface grinding and conveyance has also been proposed (see, for example, Patent Literatures 1 and 2 below).

CITATION LIST

Patent Literature

Patent Literature 1: Japanese Patent No. 4565804
Patent Literature 2: Japanese Patent No. 4936667

SUMMARY OF INVENTION

Technical Problem

However, in order to attain thickness reduction of semiconductor elements, it has been investigated to use a thin organic substrate as the substrate, and specifically, development of a coreless substrate not using a core layer, which is obtained by impregnating a glass cloth with a thermosetting resin, has been actively conducted. Since the coreless substrate does not have a core layer, the layer thickness of the substrate can be decreased; on the other hand, since a highly elastic core layer is not present, it is difficult to secure rigidity of the substrate itself, and handleability in the production process of semiconductor elements becomes a problem to be solved.

Thus, an object of the present invention is to provide a method for producing an electronic device by which an electronic device including a semiconductor element with a reduced thickness can be produced with high productivity by using an organic substrate, and a substrate-conveying support tape which can be used for the method.

Solution to Problem

In order to solve the above-described problems, the present inventors have conducted studies on the production of a semiconductor element that uses a coreless substrate and on the production of an electronic device that uses the semiconductor element. Regarding the problem of handleability, there is a problem of deflection in the organic substrate during conveyance; however, as means for solving this problem, a substrate-conveying support tape temporarily fixing a support film for substrate conveyance to the organic substrate has been studied. In the process using such a tape, it is necessary to peel the pasted support film from the organic substrate; however, since the remaining of the temporary fixing material on the organic substrate may cause mechanical and electrical connection failures in an assembling step of the organic substrate, a problem arises, for example, in that the number of steps, such as a step of removing the temporary fixing material, is increased. Therefore, it is desirable that the peel strength between the support film and the temporary fixing material is higher. Furthermore, considering how to cope with a high-temperature process in the production of a semiconductor element, it is desirable that the support film is excellent in heat resistance.

Note that, since conventional technologies including the aforementioned patent literatures and the like assume processing of semiconductor wafers, although the peelability of the temporary fixing material with respect to silicon wafers has been studied, there is no finding on the balance between the peelability with respect to a thin organic substrate and the peel strength with respect to an organic substrate and a support film.

In this regard, the present inventors have further conducted studies, and as a result, have found that the peel strength between a support film and a temporary fixing material layer can be enhanced by treating a surface of a specific support film excellent in heat resistance with a specific compound and providing a specific temporary fixing material layer on the treated surface, thereby completing the present invention on the basis of this finding.

According to an aspect of the present invention, there is provided a substrate-conveying support tape including: a support film; a primer layer provided on the support film; and a temporary fixing material layer provided on the primer layer, in which the support film is a polyimide film, the temporary fixing material layer contains a thermoplastic resin, and the primer layer contains at least one selected from the group consisting of a silane coupling agent having an epoxy group or a ureido group, an epoxy resin, a polyurethane rubber, and an acrylic rubber having an acid value of 5 mgKOH/g or more.

According to the substrate-conveying support tape according to the present invention, an organic substrate can be reinforced by a polyimide film, the handleability of the organic substrate can be improved, and at the same time, the peel strength between the support film and the temporary fixing material layer is enhanced. Thus, the support film can be easily peeled from the organic substrate that has undergone a predetermined processing (particularly, a high-temperature process of 260° C. or higher such as a reflow process) along with the temporary fixing material layer. According to this, an electronic device including a semiconductor element with a reduced thickness can be produced with high productivity by using an organic substrate.

From the viewpoint of further enhancing the peel strength between the support film and the temporary fixing material layer, the acrylic rubber may have a glass transition temperature of 5° C. or lower.

From the viewpoint of improving heat resistance, the temporary fixing material layer may further contain a thermosetting resin.

Furthermore, the substrate-conveying support tape according to the present invention may satisfy the following condition.

When a laminate, which is obtained by pasting the substrate-conveying support tape to a substrate having a main surface provided with a solder resist so that the temporary fixing material layer is in contact with the main surface of the substrate and which includes the substrate, the temporary fixing material layer, the primer layer, and the support film in this order, is heated for 30 minutes at 130° C. for 1 hour at 170° C. and for 5 minutes at 260° C., a 90° peel strength at 25° C. between the temporary fixing material layer and the support film is larger than a 90° peel strength at 25° C. between the substrate and the temporary fixing material layer.

The above-described substrate-conveying support tape may further satisfy the following condition.

The 90° peel strength between the substrate and the temporary fixing material layer is 30 N/m or more and 300 N/m or less.

The substrate-conveying support tape according to the present invention may be used for conveying a coreless substrate.

According to another aspect of the present invention, there is provided a method for producing an electronic device, the method including: a first step of pasting the above-described substrate-conveying support tape according to the present invention to an organic substrate having a thickness of 10 to 1000 μm so that the temporary fixing material layer is in contact with the organic substrate so as to obtain a laminate including the support film, the primer layer, the temporary fixing material layer, and the organic substrate in this order; a second step of heating the temporary fixing material layer of the laminate; a third step of mounting a semiconductor chip on the organic substrate of the laminate that has been subjected to the second step; a fourth step of sealing the semiconductor chip mounted on the organic substrate with a sealing material; and a fifth step of peeling the support film, the primer layer, and the temporary fixing material layer from the organic substrate of the laminate that has been subjected to the fourth step.

According to the method for producing an electronic device according to the present invention, an electronic device including a semiconductor element with a reduced thickness can be produced with high productivity by using an organic substrate. That is, in this production method, since the substrate-conveying support tape according to the present invention is used, the above-mentioned effects can be provided due to the following factors: (i) an organic substrate can be reinforced by a polyimide film in the first step and the handleability of the thin organic substrate is improved; (ii) even in a case where a high-temperature process is included in the second step, the third step, and the fourth step, the organic substrate can be sufficiently supported by a polyimide film having excellent heat resistance, and packaging and sealing of a semiconductor chip can be efficiently achieved; and (iii) the support film can be easily peeled from the organic substrate along with the temporary fixing material layer in the fifth step.

The above-described organic substrate may be a coreless substrate. Furthermore, a thickness of the above-described organic substrate may be 200 μm or less.

Advantageous Effects of Invention

According to the present invention, it is possible to provide a method for producing an electronic device by which an electronic device including a semiconductor element with a reduced thickness can be produced with high productivity by using an organic substrate, and a substrate-conveying support tape which can be used for the method.

The substrate-conveying support tape according to the present invention can improve the handleability of the organic substrate, and at the same time, the support film can be easily peeled from the organic substrate along with the temporary fixing material layer.

BRIEF DESCRIPTION OF DRAWINGS

FIG. 1(A) is a top view, and FIG. 1(B) is a schematic cross-sectional view taken along line I-I in FIG. 1(A).

FIGS. 4(f) to 4(h) are schematic cross-sectional views for describing an embodiment of the method for producing an electronic device.

DESCRIPTION OF EMBODIMENTS

Hereinafter, embodiments for carrying out the present invention will be specifically described with reference to the drawings depending on circumstances. However, the present invention is not limited to the following embodiments. Note that, in the present specification, "(meth)acrylic acid" means acrylic acid or methacrylic acid, and "(meth)acrylate" means acrylate or methacrylate corresponding thereto. The expression "A or B" means that either one of A and B may be contained or both of A and B may be contained.

Furthermore, in the present specification, the term "layer" encompasses a structure of a shape thereof formed all over a surface seen as a plan view and also a structure of a shape thereof partially formed. Furthermore, in the present specification, the term "step" includes not only an independent step, and even if one step cannot be clearly distinguished from other steps, such step is included in the "step" as long as effects intended to be exerted by this step is attained. Furthermore, a numerical range expressed by using "to" indicates a range including the numerical values before and after "to" as the minimum value and the maximum value, respectively.

Further, in the present specification, in a case where a plurality of substances corresponding to each component exist in a composition, a content of each component in the composition means the total amount of the plurality of substances that exist in the composition, unless otherwise specified. Furthermore, unless otherwise specified, exemplified materials may be used alone or may be used in combination of two or more kinds thereof.

Furthermore, in a numerical range described in the present specification in a stepwise manner, an upper or lower limit value of a numerical range in a certain level may be replaced with an upper or lower limit value of a numerical range in another level. Furthermore, in a numerical range described in the present specification, an upper or lower limit value of the numerical range may be replaced with a value shown in Examples.

[Substrate-Conveying Support Tape]

A substrate-conveying support tape of the present embodiment includes a support film, a primer layer provided on the support film, and a temporary fixing material layer provided on the primer layer.

Figure 1:
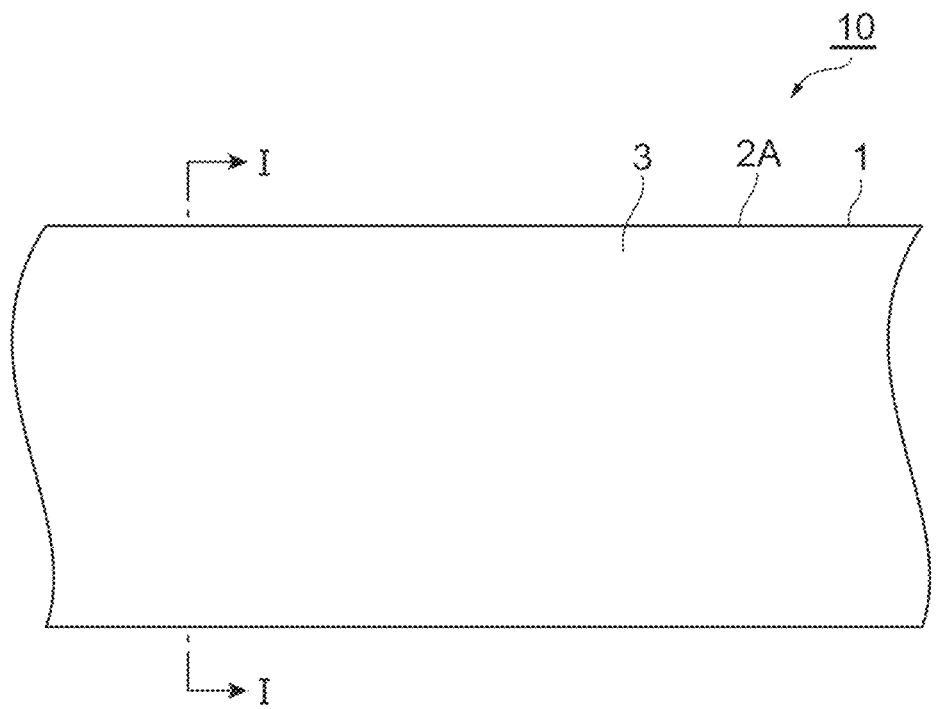
FIG. 1 is a diagram illustrating an embodiment of a substrate-conveying support tape.
Figure 1:
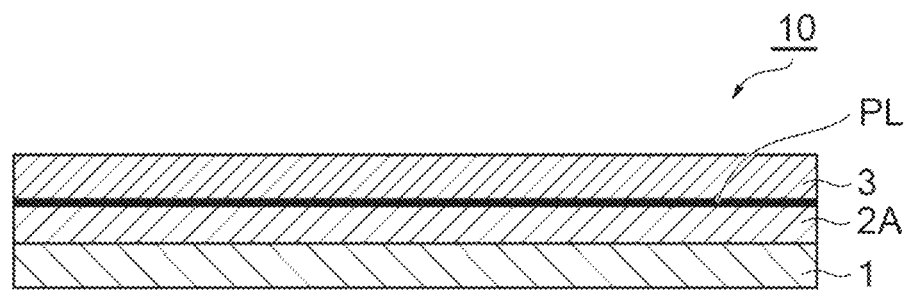

FIG. 1 is a diagram illustrating an embodiment of a substrate-conveying support tape, FIG. 1(A) is a top view, and FIG. 1(B) is a schematic cross-sectional view taken along line I-I in FIG. 1(A). A substrate-conveying support tape 10 illustrated in these drawings incudes a support film 1, a primer layer PL, a temporary fixing material layer 2A, and a protective film 3 in this order.

In the present embodiment, a polyimide film is used as the support film 1. As the polyimide film, for example, commercially available products such as 100EN (manufactured by DU PONT-TORAY CO., LTD., product name) can be used.

The thickness of the support film 1 can be appropriately set according to target strength and flexibility, and is preferably 3 to 350 μm. When the thickness is 3 μm or more, there is a tendency that a sufficient film strength is obtained, and when the thickness is 350 μm or less, there is a tendency that sufficient flexibility is obtained. From such viewpoints, the thickness of the support film 1 is more preferably 5 to 200 μm and further preferably 7 to 150 μm.

The primer layer PL can contain at least one selected from the group consisting of a silane coupling agent having an epoxy group or a ureido group, an epoxy resin, a polyurethane rubber, and an acrylic rubber having an acid value of 5 mgKOH/g or more.

Examples of the silane coupling agent having an epoxy group or a ureido group include 3-glycidoxypropyltrimethoxysilane, 3-ureidopropyltrialkoxysilane, 3-aminopropyltriethoxysilane, 3-mercaptopropyltrimethoxysilane, and N-phenyl-3-aminopropyltrimethoxysilane. As such a silane coupling agent, commercially available products such as KBM303, KBM402, KBM403, KBE402, KBE403, and KBE585 (above all, manufactured by Shin-Etsu Chemical Co., Ltd., product names) can be used.

Examples of the epoxy resin include polyfunctional epoxy resins. As such an epoxy resin, commercially available products such as EX-810P (above all, manufactured by Nagase ChemteX Corporation, product name) can be used.

Examples of the polyurethane rubber include polyether-based polyurethanes, and those which can be dissolved in an organic solvent are preferred. As such polyurethane rubber, commercially available products such as T-8175N and T-8180N (above all, manufactured by DIC Covestro Polymer Ltd., product names) can be used.

The weight average molecular weight of the polyurethane rubber is preferably 50,000 to 250,000 and more preferably 100,000 to 200,000. The weight average molecular weight is a value in terms of polystyrene using a calibration curve of standard polystyrene by gel permeation chromatography (GPC).

As the acrylic rubber having an acid value of 5 mgKOH/g or more, for example, commercially available products such as SG708-6, WS-023 EK30, and SG-70L (above all, manufactured by Nagase ChemteX Corporation, product names) can be used.

From the viewpoint of further enhancing the peel strength between the support film and the temporary fixing material layer, the acid value of the acrylic rubber is preferably 10 mgKOH/g or more, more preferably 15 mgKOH/g or more, and further preferably 18 mgKOH/g or more.

The acid value can be measured by a neutralization titration method based on JIS K0070 as described below. First, a solution of acrylic rubber is heated for 1 hour at 130° C. to remove volatile components, thereby obtaining solid components. Then, after 1.0 g of acrylic rubber of the solid components is weighted, 30 g of acetone is added to this acrylic rubber, and this mixture is homogeneously dissolved so as to obtain a resin solution. Next, an appropriate amount of phenolphthalein that is an indicator is added to this resin solution, and titration is performed by using 0.1 mol/L of a potassium hydroxide aqueous solution. Then, the acid value is calculated by the following equation.

$$\text{Acid value} = 0.1 \times V \times f_1 \times 56.1/(Wp \times I/100)$$

In the equation, V represents the titer (mL) of 0.1 mol/L of the potassium hydroxide aqueous solution used for titration, $f_1$ represents the factor (concentration conversion factor) of 0.1 mol/L of the potassium hydroxide aqueous solution, Wp represents the measured mass (g) of the resin solution, and I represents the measured proportion (% by mass) of non-volatile components in the resin solution described above.

From the viewpoint of further enhancing the peel strength between the support film and the temporary fixing material layer, the glass transition temperature of the acrylic rubber is preferably 5° C. or lower, more preferably 0° C. or lower, further preferably −5° C. or lower, and even more preferably −8° C. or lower.

The glass transition temperature of the acrylic rubber can be obtained in the same manner as in a method of measuring the glass transition temperature of the thermoplastic resin contained in the temporary fixing material layer described below.

The weight average molecular weight of the acrylic rubber is preferably 100,000 to 1,200,000 and more preferably 200,000 to 1,000,000, from the viewpoint of easily securing film forming properties and fluidity. The weight average molecular weight is a value in terms of polystyrene using a calibration curve of standard polystyrene by gel permeation chromatography (GPC).

The primer layer PL can be formed by applying a treatment liquid containing the above-described compound onto the surface of the support film 1 and drying the treatment liquid.

An organic solvent that can disperse or dissolve the above-described compound may be contained in the treatment liquid. The organic solvent is not particularly limited, and can be selected on the basis of a boiling point in consideration of volatility or the like at the time of film formation. Specifically, it is preferable to use solvents having a relatively low boiling point such as methanol, ethanol, 2-methoxyethanol, 2-ethoxyethanol, 2-butoxyethanol, methyl ethyl ketone, acetone, methyl isobutyl ketone, toluene, and xylene, from the viewpoint that curing of a film hardly proceeds at the time of film formation. Furthermore, from the viewpoint of improving film forming properties, for example, solvents having a relatively high boiling point such as dimethylacetamide, dimethylformamide, N-methylpyrrolidone, and cyclohexanone are preferably used. These solvents may be used alone or in combination of two or more kinds thereof. The solid content concentration in the treatment liquid (varnish) is preferably 10 to 80% by mass.

The application is preferably performed so that the thickness after drying is 100 nm to 10 µm. The drying can be performed by typically performing heating at 60° C. to 200° C. for 0.1 to 90 minutes although the condition is not particularly limited as long as it is a condition that the used solvent vaporizes sufficiently.

The protective film 3 is not particularly limited, and examples thereof include a polyethylene terephthalate film, a polybutylene telephthalate film, a polyethylene naphthalate film, a polyethylene film, and a polypropylene film. The protective film 3 is preferably a polyethylene terephthalate film, a polyethylene film, and a polypropylene film, from the viewpoints of flexibility and toughness. Furthermore, from the viewpoint of improving peelability between the protective film and the temporary fixing material layer, it is preferable to use a film subjected to a release treatment by a silicone-based compound, a fluorine-based compound, and the like as the protective film 3.

The thickness of the protective film 3 can be appropriately set according to target strength and flexibility, and is, for example, preferably 10 to 350 µm. When the thickness is 10 µm or more, there is a tendency that a sufficient film strength is obtained, and when the thickness is 350 µm or less, there is a tendency that sufficient flexibility is obtained. From such viewpoints, the thickness of the protective film 3 is more preferably 15 to 200 µm and further preferably 20 to 150 µm.

The temporary fixing material layer 2A contains (A) a thermoplastic resin, and may contain (B) a thermosetting resin, (C) a silicone compound, (D) a curing accelerator, and other components as necessary.

As the thermoplastic resin (A), a resin having thermoplasticity before the organic substrate and the support are pasted together can be used without any particular limitations. In the present embodiment, the thermoplastic resin may be a resin forming a cross-linked structure by heating or the like. Examples of such a resin include a polymer having a cross-linkable functional group.

Examples of the polymer having a cross-linkable functional group include a thermoplastic polyimide resin, a (meth)acrylic copolymer having a cross-linkable functional group, a urethane resin, a polyphenylene ether resin, a polyetherimide resin, a phenoxy resin, and a modified polyphenylene ether resin. Among these, a (meth)acrylic copolymer having a cross-linkable functional group is preferred.

As the (meth)acrylic copolymer having a cross-linkable functional group, those obtained by a polymerization method such as pearl polymerization or solution polymerization may be used or commercially available products may be used. The polymer having a cross-linkable functional group may have a cross-linkable functional group in the polymer chain or at the polymer chain terminal. Specific examples of the cross-linkable functional group include an epoxy group, an alcoholic hydroxyl group, a phenolic hydroxyl group, and a carboxyl group. Among these cross-linkable functional groups, a carboxyl group is preferred. The carboxyl group can be introduced into the polymer chain by using acrylic acid.

The glass transition temperature (hereinafter, also referred to as "Tg" in some cases) of the thermoplastic resin is preferably −50° C. to 50° C. and more preferably −40° C. to 20° C. When the Tg is in such a range, it is possible to obtain more adequate fluidity while suppressing the deterioration of handleability caused by an excessive increase in tackiness, and it is possible to further lower the elastic modulus after curing, so that an excessive increase in the peel strength can be further suppressed.

The Tg is a midpoint glass transition temperature value obtained when the thermoplastic resin is measured using differential scanning calorimetry (DSC, for example, "Thermo Plus 2" manufactured by Rigaku Corporation). Specifically, the above-described Tg is a midpoint glass transition temperature calculated by the method according to JIS K 7121:1987 by measuring a change in calorific value under the conditions of a temperature increase rate of 10° C./min and a measurement temperature of −80° C. to 80° C.

The weight average molecular weight of the thermoplastic resin is not particularly limited, and is preferably 100,000 to 1,200,000 and more preferably 200,000 to 1,000,000. When the weight average molecular weight of the thermoplastic resin is in such a range, film formability and fluidity are easily secured. The weight average molecular weight is a value in terms of polystyrene using a calibration curve of standard polystyrene by gel permeation chromatography (GPC).

The thermoplastic resin may be used alone or in combination of two or more kinds thereof.

Examples of the thermosetting resin (B) include an epoxy resin, an acrylic resin, a silicone resin, a phenolic resin, a thermosetting polyimide resin, a polyurethane resin, a melamine resin, and a urea resin.

The epoxy resin is not particularly limited as long as it is cured and has a heat-resistant effect. As the epoxy resin, a bifunctional epoxy resin such as bisphenol A type epoxy, a novolac type epoxy resin such as a phenol novolac type epoxy resin or a cresol novolac type epoxy resin, and the like can be used. Furthermore, as the epoxy resin, a generally known resin such as a polyfunctional epoxy resin, a glycidyl amine type epoxy resin, a heterocyclic ring-containing epoxy resin, or an alicyclic epoxy resin can be used.

Examples of the bisphenol A type epoxy resin include jER (registered trademark) series (Epikote 807, Epikote 815, Epikote 825, Epikote 827, Epikote 828, Epikote 834, Epikote 1001, Epikote 1004, Epikote 1007, and Epikote 1009, "Epikote" is the registered trademark) manufactured by Mitsubishi Chemical Corporation, DER-330, DER-301, and DER-361 manufactured by The Dow Chemical Company, and YD8125 and YDF8170 manufactured by Nippon Steel & Sumikin Chemical Co., Ltd.

Examples of the phenol novolac type epoxy resin include Epikote 152 and Epikote 154 manufactured by Japan Epoxy Resins Co., Ltd., EPPN-201 manufactured by Nippon Kayaku Co., Ltd., and DEN-438 manufactured by The Dow Chemical Company.

Examples of an o-cresol novolac type epoxy resin include EOCN-102S, EOCN-103S, EOCN-104S, EOCN-1012, EOCN-1025, and EOCN-1027 manufactured by Nippon Kayaku Co., Ltd. ("EOCN" is the registered trademark) and YDCN701, YDCN702, YDCN703, and YDCN704 manufactured by Nippon Steel & Sumikin Chemical Co., Ltd.

Examples of the polyfunctional epoxy resin include Epon 1031S manufactured by Japan Epoxy Resins Co., Ltd., ARALDITE 0163 manufactured by Huntsman Japan, and DENACOL EX-611, EX-614, EX-614B, EX-622, EX-512, EX-521, EX-421, EX-411, and EX-321 manufactured by Nagase ChemteX Corporation ("ARALDITE" and "DENACOL" are the registered trademarks).

Examples of the amine type epoxy resin include Epikote 604 manufactured by Japan Epoxy Resins Co., Ltd., YH-434 manufactured by Nippon Steel & Sumikin Chemical Co., Ltd., TETRAD-X and TETRAD-C manufactured by MITSUBISHI GAS CHEMICAL COMPANY, INC. ("TETRAD" is the registered trademark), and ELM-120 manufactured by SUMITOMO CHEMICAL COMPANY, LIMITED.

Examples of the heterocyclic ring-containing epoxy resin include ARALDITE PT810 manufactured by Ciba Specialty Chemicals Inc., and ERL4234, ERL4299, ERL4221, and ERL4206 manufactured by UCC.

The aforementioned epoxy resin may be used alone or in combination of two or more kinds thereof.

In the case of using an epoxy resin as a thermosetting resin, it is preferable to use an epoxy resin curing agent in combination therewith.

As the epoxy resin curing agent, a known curing agent which is generally used can be used. Examples of the epoxy resin curing agent include amines, polyamides, acid anhydrides, polysulfides, boron trifluoride, bisphenols having two or more phenolic hydroxyl groups in one molecule such as bisphenol A, bisphenol F, and bisphenol S, and phenolic resins such as a phenol novolac resin, a bisphenol A novolac resin, and a cresol novolac resin. Particularly, from the viewpoint of having excellent electric corrosion resistance upon absorption of moisture, the epoxy resin curing agent is preferably phenolic resins such as a phenol novolac resin, a bisphenol A novolac resin, and a cresol novolac resin are preferred.

Preferred examples of the phenolic resin as the above-described epoxy resin curing agent include trade names: PHENOLITE LF2882, PHENOLITE LF2822, PHENOLITE TD-2090, PHENOLITE TD-2149, PHENOLITE VH-4150, and PHENOLITE VH4170 manufactured by DIC Corporation, trade name: H-1 manufactured by Meiwa Plastic Industries, Ltd., trade names: jERCURE MP402FPY, Epicure YL6065, and Epicure YLH129B65 manufactured by Japan Epoxy Resins Co., Ltd., and trade names: MILEX XL, MILEX XLC, MILEX RN, MILEX RS, and MILEX VR manufactured by Mitsui Chemicals, Inc. ("PHENOLITE", "Epicure", and "MILEX" are the registered trademarks).

Each of the thermosetting resin and the curing agent may be used alone or in combination of two or more kinds thereof.

The content of the thermosetting resin in the temporary fixing material layer is preferably 10 to 500 parts by mass and more preferably 20 to 300 parts by mass with respect to 100 parts by mass of the thermoplastic resin. When the content of the thermosetting resin is within the above-described range, the temporary fixing material layer can easily have sufficient low-temperature pasting property, heat resistance, curability, and peelability. When the content of the thermosetting resin is 10 parts by mass or more, pasting property and heat resistance are improved, and at the same time, retainability of the organic substrate during the production of an electronic device is also improved. Thus, there is a tendency that the component parts (for example, a semiconductor chip) constituting the electronic device are not likely to be damaged. On the other hand, when the content of the thermosetting resin is 500 parts by mass or less, the viscosity before curing is not likely to become excessively low, curing can be performed in a relatively short time, and there is a tendency that it is easy to achieve both the retainability of the organic substrate and the support film and the peelability between the organic substrate and the support film.

As the silicone compound (C), any compound can be used without particular limitation as long as it has a polysiloxane structure. Examples thereof include a silicone-modified resin, straight silicone oil, nonreactive modified silicone oil, and reactive modified silicone oil.

By the temporary fixing material layer containing a silicone compound, when the temporary fixing material layer is peeled from the organic substrate that has undergone predetermined processing, the temporary fixing material layer can be easily peeled without using a solvent even at a low temperature of 100° C. or lower.

Examples of the silicone-modified resin include a silicone-modified alkyd resin. Examples of the modified silicone oil include polyether-modified silicone, alkyl-modified silicone, and epoxy-modified silicone.

Examples of commercially available products of the aforementioned silicone compound include trade names: SH3773M, L-7001, SH-550, and SH-710 manufactured by Dow Corning Toray Co., Ltd., trade names: X-22-163, KF-105, X-22-163B, and X-22-163C manufactured by Shin-Etsu Chemical Co., Ltd., and trade name: BYK-UV3500 manufactured by BYK.

The silicone compound can be used alone or in combination of two or more kinds thereof.

The content of the silicone compound in the temporary fixing material layer is preferably 0 to 100 parts by mass and more preferably 0.01 to 80 parts by mass with respect to 100 parts by mass of the thermoplastic resin. When the content of the silicone compound is in the above-described range, both adhesiveness with respect to the organic substrate at the time of processing and peelability with respect to the organic substrate after processing can be achieved at a higher level.

Examples of the curing accelerator (D) include imidazoles, dicyandiamide derivatives, dicarboxylic acid dihydrazides, triphenylphosphine, tetraphenylphosphonium tetraphenylborate, 2-ethyl-4-methylimidazole-tetraphenylborate, and 1,8-diazabicyclo[5,4,0]undecene-7-tetraphenylborate.

In a case where the temporary fixing material layer contains a (meth)acrylic copolymer having an epoxy group as the thermoplastic resin, it is preferable to further contain a curing accelerator promoting the curing of the epoxy group that this acrylic copolymer has.

The curing accelerator may be used alone or in combination of two or more kinds thereof.

The content of the curing accelerator in the temporary fixing material layer is preferably 0.01 to 5.0 parts by mass with respect to the total of 100 parts by mass of the polymer (thermoplastic resin) having a cross-linkable functional group and the thermosetting resin contained in the composition. When the content of the curing accelerator is 0.01 parts by mass or more, it becomes easy to sufficiently cure the temporary fixing material layer by the thermal history at the time of producing a semiconductor element, and the organic substrate and the support film can be fixed more reliably. On the other hand, when the content of the curing accelerator is 5.0 parts by mass or less, the melt viscosity of the temporary fixing material layer does not increase excessively, and the storage stability of the substrate-conveying support tape is easily secured.

Examples of the other components include fillers such as an inorganic filler and an organic filler and a silane coupling agent.

Examples of the inorganic filler include metal fillers such as silver powder, gold powder, and copper powder; and non-metallic inorganic fillers such as silica, alumina, boron nitride, titania, glass, iron oxide, and ceramics. The inorganic filler can be selected according to desired functions. The metal filler can be added for providing thixotropy property to the temporary fixing material layer. The non-metallic inorganic filler can be added for providing low thermal expansion property and low hygroscopic property to the temporary fixing material layer. The inorganic filler may be used alone or in combination of two or more kinds thereof.

The inorganic filler preferably has an organic group on a surface. When the surface of the inorganic filler is modified with the organic group, dispersibility of components, which constitute the temporary fixing material layer, into an organic solvent at the time of preparing a coating liquid for forming a temporary fixing material layer and adhesiveness and heat resistance of the temporary fixing material layer are easily improved.

The inorganic filler having an organic group on a surface can be obtained, for example, by mixing a silane coupling agent represented by General Formula (B-1) below and an inorganic filler and stirring them at a temperature of 30° C. or higher. The fact that the surface of the inorganic filler is modified with the organic group can be confirmed by UV (ultraviolet rays) measurement, IR (infrared rays) measurement, XPS (X-ray photoemission spectroscopy) measurement, and the like.

(B-1)

[In Formula (B-1), "X" represents an organic group selected from the group consisting of a phenyl group, a glycidoxy group, an acryloyl group, a methacryloyl group, a mercapto group, an amino group, a vinyl group, an isocyanate group, and a methacryloxy group, "s" represents an integer of 0 or 1 to 10, and $R^{11}$, $R^{12}$, and $R^{13}$ each independently represent an alkyl group having 1 to 10 carbon atoms.]

Examples of the alkyl group having 1 to 10 carbon atoms include a methyl group, an ethyl group, a propyl group, a butyl group, a pentyl group, a hexyl group, a heptyl group, an octyl group, a nonyl group, a decyl group, an isopropyl group, and an isobutyl group. The alkyl group having 1 to 10 carbon atoms is preferably a methyl group, an ethyl group, and a pentyl group from the viewpoint of ease of availability.

From the viewpoint of heat resistance, "X" is preferably an amino group, a glycidoxy group, a mercapto group, and an isocyanate group and more preferably a glycidoxy group and a mercapto group.

"s" in Formula (B-1) is preferably 0 to 5 and more preferably 0 to 4 from the viewpoints of suppressing the fluidity of the temporary fixing material at high temperatures and improving heat resistance.

Preferred examples of the silane coupling agent include trimethoxyphenylsilane, dimethyldimethoxyphenylsilane, triethoxyphenylsilane, dimethoxymethylphenylsilane, vinyltrimethoxysilane, vinyltriethoxysilane, vinyltris(2-methoxyethoxy)silane, N-(2-aminoethyl)-3-aminopropylmethyldimethoxysilane, N-(2-aminoethyl)-3-aminopropyltrimethoxysilane, 3-aminopropyltriethoxysilane, 3-aminopropyltrimethoxysilane, 3-glycidoxypropyltrimethoxysilane, 3-glycidoxypropylmethyldimethoxysilane, 2-(3,4-epoxycyclohexyl)ethyltrimethoxysilane, 3-isocyanatopropyltriethoxysilane, 3-methacryloxypropyltrimethoxysilane, 3-mercaptopropyltrimethoxysilane, 3-ureidopropyltriethoxysilane, N-(1,3-dimethylbutylidene)-3-(triethoxysilyl)-1-propanamine, N,N'-bis(3-(trimethoxysilyl)propyl)ethylenediamine, polyoxyethylenepropyltrialkoxysilane, and polyethoxydimethylsiloxane. Among these, 3-aminopropyltriethoxysilane, 3-glycidoxypropyltrimethoxysilane, 3-isocyanatopropyltriethoxysilane, and 3-mercaptopropyltrimethoxysilane are preferred, and trimethoxyphenylsilane, 3-glycidoxypropyltrimethoxysilane, and 3-mercaptopropyltrimethoxysilane are more preferred.

The silane coupling agent may be used alone and may be used in combination of two or more kinds thereof.

The used amount of the above-described coupling agent is preferably 0.01 to 50 parts by mass and more preferably 0.05 to 20 parts by mass with respect to 100 parts by mass of the inorganic filler from the viewpoint of attaining a balance between the effect of improving heat resistance and storage stability and is further preferably 0.5 to 10 parts by mass from the viewpoint of improving heat resistance.

The content of the inorganic filler in the temporary fixing material layer is preferably 300 parts by mass or less, more preferably 200 parts by mass or less, and further preferably 100 parts by mass or less with respect to 100 parts by mass of the thermoplastic resin, from the viewpoints of improving the handleability of the temporary fixing material layer in the B-stage state and improving the low thermal expansion properties. The lower limit of the content of the inorganic filler is not particularly limited, but is preferably 5 parts by mass or more with respect to 100 parts by mass of the thermoplastic resin. When the content of the inorganic filler is in the above-described range, there is a tendency that a desired function can be provided while sufficiently securing adhesiveness with respect to the organic substrate.

Examples of the organic filler include carbon, a rubber-based filler, silicone-based fine particles, polyamide fine particles, and polyimide fine particles.

The content of the organic filler in the temporary fixing material layer is preferably 300 parts by mass or less, more preferably 200 parts by mass or less, and further preferably 100 parts by mass or less with respect to 100 parts by mass of the thermoplastic resin. The lower limit of the content of the organic filler is not particularly limited, but is preferably 5 parts by mass or more with respect to 100 parts by mass of the thermoplastic resin. When the content of the organic filler is in the above-described range, there is a tendency that a desired function can be provided while sufficiently securing adhesiveness with respect to the organic substrate.

The shear viscosity at 60° C. of the temporary fixing material layer is preferably 100 to 10000 Pa·s, more preferably 500 to 9000 Pa·s, and further preferably 1000 to 8000 Pa·s, from the viewpoint of substrate embeddability. Furthermore, the shear viscosity at 60° C. is more preferably 1000 to 9000 Pa·s, further preferably 2000 to 8000 Pa·s, and even more preferably 3000 to 7000 Pa·s, from the viewpoint of lamination properties.

The shear viscosity is measured by the following procedure. First, four sheets of a temporary fixing material layer (temporary fixing material film) having a thickness of 60 μm are laminated at 80° C. to produce a sample for measurement having a thickness of 240 μm. This sample for measurement is heated from 35° C. to 200° C. at a temperature increase rate of 20° C./min while applying 5% strain using a rotating type viscoelasticity measuring apparatus (manufactured by TA Instruments, ARES) set under the following conditions, and the viscosity at the time of reaching 60° C. is measured.
Measurement method: "parallel plate"
Measurement jig: Circular jig having a diameter of 8 mm
Measurement mode: "Dynamic temperature ramp"
Frequency: 1 Hz The above-described shear viscosity at 60° C. can be adjusted, for example, by the blending amount of the component (A) (particularly, the (meth)acrylic copolymer having a cross-linkable functional group). Furthermore, the shear viscosity at 60° C. may be adjusted by changing the Tg and the molecular weight of the thermoplastic resin, changing the Tm and the molecular weight of the thermosetting resin, changing the blending ratio of the thermoplastic resin and the thermosetting resin, adding a filler and a resin, and the like.

The elastic modulus at 25° C. of the temporary fixing material layer after heating for 30 minutes at 130° C. and for 1 hour at 170° C. is preferably 10 to 1000 MPa, more preferably 100 to 900 MPa, and further preferably 200 to 800 MPa, from the viewpoint of substrate conveyance properties. Furthermore, the above-described elastic modulus at 25° C. after heating is more preferably 50 to 970 MPa, further preferably 100 to 940 MPa, and even more preferably 200 to 900 MPa, from the viewpoint of peelability and rigidity.

The elastic modulus after heating is measured by the following procedure. First, four sheets of a temporary fixing material layer (temporary fixing material film) having a thickness of 60 μm are laminated at 80° C. to produce a film having a thickness of 240 μm. This film is heated under predetermined conditions (for example, heated for 30 minutes in an oven set at 130° C. and further for 1 hour at 170° C.), and then is cut in the thickness direction so as to have a width of 4 mm and a length of 33 mm. The cut film is set on a dynamic viscoelasticity apparatus (product name: Rheogel-E4000, manufactured by UMB), a tensile load is applied to the film, the elastic modulus at 25° C. is measured at a frequency of 10 Hz and a temperature increase rate of 3° C./min, and the measured value at 25° C. is recorded.

Further, the elastic modulus at 25° C. of the temporary fixing material layer after heating for 30 minutes at 130° C., for 1 hour at 170° C., and for 5 minutes at 260° C. is preferably 10 to 1000 MPa, more preferably 200 to 900 MPa, and further preferably 300 to 800 MPa, from the viewpoint of substrate conveyance properties.

The above-described elastic modulus at 25° C. after heating can be adjusted, for example, by the blending amount of the component (A) (particularly, the (meth) acrylic copolymer having a cross-linkable functional group) and the blending amount of the component (B) (particularly, the phenolic resin). Furthermore, the elastic modulus at 25° C. after heating may be adjusted by changing the Tg, the molecular weight, and the number of functional groups of the thermoplastic resin, changing the number of functional groups of the thermosetting resin, changing the blending ratio of the thermoplastic resin and the thermosetting resin, adding a filler and a resin, and the like.

The 5% weight reduction temperature of the temporary fixing material layer after heating for 30 minutes at 130° C. and for 1 hour at 170° C. is 300° C. or higher, more preferably 325° C. or higher, and further preferably 350° C. or higher, from the viewpoint of reflow resistance.

The 5% weight reduction temperature after heating is measured by the following procedure. First, four sheets of a temporary fixing material layer (temporary fixing material film) having a thickness of 60 μm are laminated at 80° C. to produce a film having a thickness of 240 μm. This film is heated under predetermined conditions (for example, heated for 30 minutes in an oven set at 130° C. and further for 1 hour at 170° C.), and then 10 mg of the film is cut as a measurement sample. The 5% weight reduction temperature after heating can be obtained by measuring this measurement sample using a differential thermal balance (manufactured by Seiko Instruments Inc., TG/DTA220) at a temperature increase rate of 10° C./min.

The above-described 5% weight reduction temperature after heating can be adjusted, for example, by the glass transition temperature of the component (A) (particularly, the (meth)acrylic copolymer having a cross-linkable functional group). Furthermore, the 5% weight reduction temperature after heating may be adjusted by changing the Tg, the molecular weight, and the number of functional groups of the thermoplastic resin, changing the number of functional groups of the thermosetting resin, changing the blending ratio of the thermoplastic resin and the thermosetting resin, adding a filler and a resin, and the like.

The 90° peel strength at 25° C. between the temporary fixing material layer and a substrate having a surface of a solder resist AUS308 after the temporary fixing material layer is laminated on the substrate and heated for 30 minutes at 130° C. and for 1 hour at 170° C. may be 30 to 300 N/m, 40 to 250 N/m, or 50 to 200 N/m. When the 90° peel strength is in the above-described range, the temporary fixing material layer is less likely to be peeled from the organic substrate at the time of processing, the handleability of the organic substrate reinforced by the support film can be further improved, and at the same time, the support film can be easily peeled from the organic substrate along with the temporary fixing material layer after processing.

The 90° peel strength is measured as follows. A substrate (material: glass epoxy substrate, substrate thickness: 1000 μm) having a surface of a solder resist "PSR-4000 AUS308" (manufactured by TAIYO INK MFG. CO., LTD., product name) is placed on a stage of a roll laminator (manufactured by Taisei Laminator Co., LTD., FAST LAMINATOR VA-400III), and a resin composition for temporary fixing that has been formed into a film shape having a thickness of 60 μm is installed so as to be pasted to the substrate. This is pasted under the conditions of a speed of 0.2 m/min, a temperature of 80° C., and a pressure of 0.2 MPa, and a sample for measurement is obtained. The obtained sample for measurement is heated under predetermined heating conditions (for example, heated for 30 minutes at 130° C. and for 1 hour at 170° C.) and then cut to have a width of 10 mm. This sample is subjected to a peel test at a speed of 300 mm/min by a peel tester set to have a peeling angle of 90°, and the peel strength at this time is regarded as the 90° peel strength.

Furthermore, from the viewpoint of application to a reflow process, the 90° peel strength at 25° C. between the temporary fixing material layer and a substrate (material: glass epoxy substrate, substrate thickness: 1000 μm) having a surface of a solder resist "PSR-4000 AUS308" (manufactured by TAIYO INK MFG. CO., LTD., product name) after the temporary fixing material layer is laminated on the substrate and heated for 30 minutes at 130° C., for 1 hour at 170° C., and for 5 minutes at 260° C. may be 30 to 300 N/m.

The thickness of the temporary fixing material layer is not particularly limited, and is preferably 10 to 350 μm from the viewpoint of sufficiently fixing the organic substrate and the support film for conveyance to each other. When the thickness is 10 μm or more, since the variation in thickness at the time of coating is decreased and the thickness is sufficient, the strength of the temporary fixing material layer or the cured product of the temporary fixing material layer becomes favorable, and the organic substrate and the support film for conveyance can be more sufficiently fixed to each other. When the thickness is 350 μm or less, the variation in thickness of the temporary fixing material layer is less likely to occur, the amount of the remaining solvent in the temporary fixing material layer can be easily decreased by sufficient drying, and thus it is possible to further reduce foam formation at the time of heating the cured product of the temporary fixing material layer.

The temporary fixing material layer 2A can be formed by a method of mixing and kneading respective components constituting the temporary fixing material layer in an organic solvent to prepare a varnish, applying the prepared varnish onto the primer layer PL of the support film 1 on which the primer layer PL is provided, and then drying the varnish.

The organic solvent is not particularly limited, but can be determined in consideration of volatility or the like at the time of film formation from boiling points. Specifically, solvents having a relatively low boiling point such as methanol, ethanol, 2-methoxyethanol, 2-ethoxyethanol, 2-butoxyethanol, methyl ethyl ketone, acetone, methyl isobutyl ketone, toluene, and xylene are preferred from the viewpoint that curing of a film hardly proceeds at the time of film formation. Further, for improving film forming properties, for example, solvents having a relatively high boiling point such as dimethylacetamide, dimethylformamide, N-methylpyrrolidone, and cyclohexanone are preferably used. These solvents may be used alone or in combination of two or more kinds thereof. The solid content concentration in the varnish is preferably 10 to 80% by mass.

The mixing and kneading can be performed by using conventional dispersers such as a stirrer, a Raikai mixer, a three-roll mill, and a ball mill, and appropriately combining these. The drying can be performed by typically performing heating at 60° C. to 200° C. for 0.1 to 90 minutes although the condition is not particularly limited as long as it is a condition that the used organic solvent vaporizes sufficiently.

The substrate-conveying support tape 10 can be obtained by forming the temporary fixing material layer 2A on the primer layer PL of the support film 1 and pasting the protective film 3 onto the temporary fixing material layer 2A.

In the present embodiment, the substrate-conveying support tape 10 may be obtained by forming the temporary fixing material layer 2A on a support film such as the protective film 3 and pasting the support film to the support film 1 on which the primer layer PL is provided.

The substrate-conveying support tape 10 can be easily stored, for example, by being wound in a roll shape. Furthermore, the roll-shaped substrate-conveying support tape 10 can also be stored in a state of being cut into a suitable size.

The aforementioned temporary fixing material layer 2A may be configured by a single layer in some cases, and the temporary fixing material layer may have a multi-layer configuration. For example, when the temporary fixing material layer has a two-layer configuration, there is an advantage that both processability and peelability after processing can be obtained with a higher level.

Regarding the temporary fixing material layers, one temporary fixing material layer and the other temporary fixing material layer may be in direct contact with each other. In this case, two layers may be integrally formed so as to be a single-layer structure, and a two-layer structure may be maintained while an interface exists between two layers.

[Method for Producing Electronic Device]

A method for producing an electronic device using the substrate-conveying support tape according to the present embodiment can include the following roughly divided five steps:

(a) a first step of pasting the substrate-conveying support tape according to the present embodiment to an organic substrate having a thickness of 10 to 1000 μm so that the temporary fixing material layer is in contact with the organic substrate so as to obtain a laminate including the support film, the primer layer, the temporary fixing material layer, and the organic substrate in this order;

(b) a second step of heating the temporary fixing material of the laminate;

(c) a third step of mounting a semiconductor chip on the organic substrate of the laminate that has been subjected to the second step;

(d) a fourth step of sealing the semiconductor chip mounted on the organic substrate with a sealing material; and (e) a fifth step of peeling the support film, the primer layer, and the temporary fixing material layer from the organic substrate of the laminate that has been subjected to the fourth step.

Figure 2:
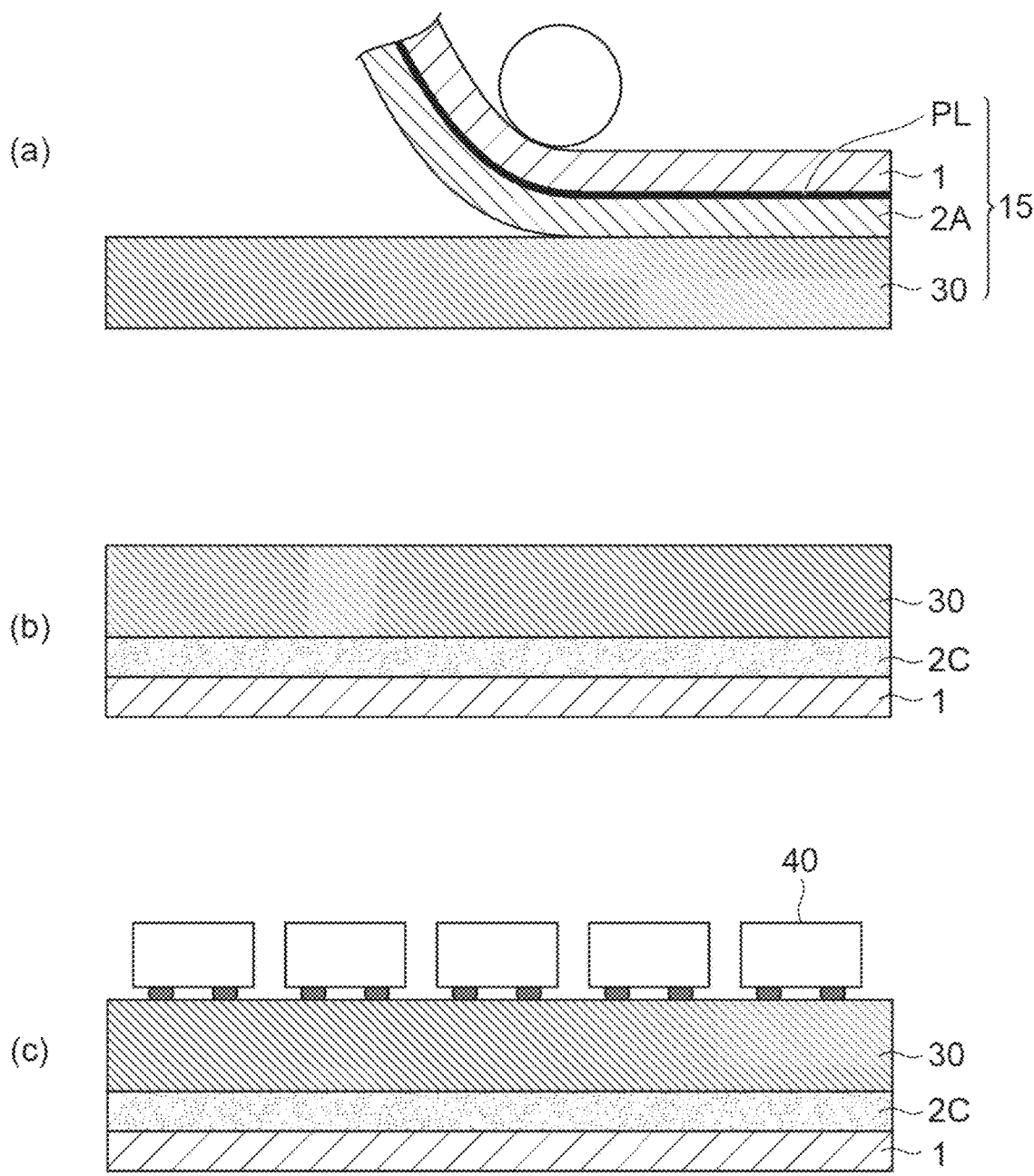
FIGS. 2(a) to 2(c) are schematic cross-sectional views for describing an embodiment of a method for producing an electronic device.
Figure 3:
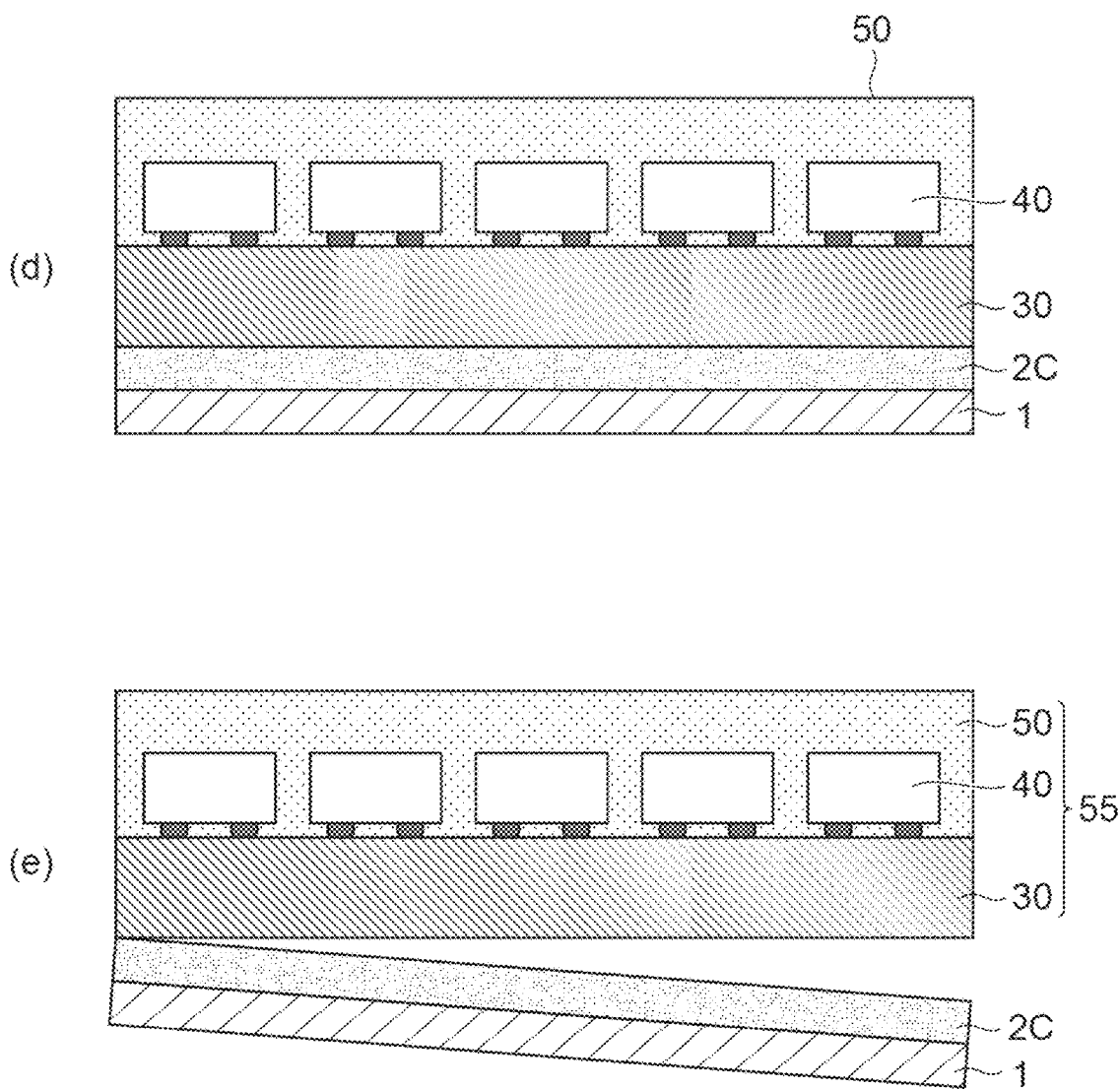
FIGS. 3(d) and 3(e) are schematic cross-sectional views for describing an embodiment of the method for producing an electronic device.

FIG. 2, FIG. 3, and FIG. 4 are schematic cross-sectional views for describing an embodiment of the method for producing an electronic device. Note that, in FIG. 2, FIG. 3, and FIG. 4, a case where the temporary fixing material layer has a single-layer configuration illustrated in FIG. 1(B) is illustrated; however, the configuration of the temporary fixing material layer is not limited thereto.

<(a) First Step>

In the first step, a laminate 15 is obtained by pasting the support film 1 to an organic substrate 30 with the temporary fixing material layer 2A and the primer layer PL interposed therebetween (FIG. 2(a)).

The organic substrate 30 may be a substrate configured from an organic substance such as a polymer or may have an organic substance at least in a portion or the entirety of the main surface. Examples of the organic substance include a photosensitive insulating material and a cured product thereof, and a photosensitive solder resist and a cured product thereof (solder resist). In a case where the organic substrate 30 has a photosensitive insulating material or a cured product thereof, or a photosensitive solder resist or a cured product thereof (solder resist) in a portion or the entirety of the surface, the surface serving as a core may be a glass epoxy substrate obtained by impregnating a glass cloth with an epoxy resin, or the like.

The thickness of the organic substrate 30 may be 500 μm or less, may be 300 μm or less, and may be 200 μm or less, from the viewpoint of reducing the thickness of a semiconductor element or an electronic device.

The organic substrate 30 may be a coreless substrate. Examples of the material for the coreless substrate include a thermosetting resin such as an epoxy resin, and a resin composition including thereof (for example, a buildup material and the like).

As illustrated in FIG. 2(*a*), in the case of obtaining the laminate 15 using the substrate-conveying support tape 10, the organic substrate 30 and the support film 1 can be laminated with the temporary fixing material layer 2A interposed therebetween, using a roll laminator. In a case where the substrate-conveying support tape 10 includes the protective film 3, the protective film 3 may be torn off before lamination, and the temporary fixing material layer 2A and the support film 1 may be laminated while tearing off the protective film 3.

As the roll laminator, for example, a roll laminator VA400III (trade name) manufactured by Taisei Laminator Co., LTD. is mentioned. In the case of using this apparatus, the organic substrate 30 and the support film 1 can be pasted together with the temporary fixing material layer 2A interposed therebetween at a pressure of 0.1 MPa to 1.0 MPa, a temperature of 40° C. to 150° C., and a speed of 0.1 to 1.0 m/min.

In the present embodiment, the substrate-conveying support tape 10, which is in a tape shape, can be continuously supplied. In this case, the organic substrate 30 reinforced by the support film 1 in a tape shape can be continuously conveyed, and improvement in productivity and the like can be achieved.

A vacuum laminator can also be used instead of a roll laminator.

Examples of the vacuum laminator include a vacuum laminator LM-50×50-S (trade name) manufactured by NPC Incorporated and a vacuum laminator V130 (trade name) manufactured by Nichigo Morton Co., Ltd. Regarding the lamination conditions, the organic substrate 30 and the support film 1 can be pasted together with the temporary fixing material layer 2A and the primer layer PL interposed therebetween at an atmospheric pressure of 1 hPa or lower, a pressure-bonding temperature of 40° C. to 150° C. (preferably 60° C. to 120° C.), a lamination pressure of 0.01 to 0.5 MPa (preferably 0.1 to 0.5 MPa), and a retention time of 1 second to 600 seconds (preferably 30 seconds to 300 seconds).

<(b) Second Step>

In the second step, the temporary fixing material layer 2A of the laminate 15 is heated. By this step, the organic substrate 30 and the support film 1 are sufficiently fixed to each other by a cured temporary fixing material layer 2C (FIG. 2(*b*)), and the handleability of the organic substrate 30 is improved.

The heating can be performed, for example, by using an explosion-proof dryer or a constant-temperature forced convection dryer (manufactured by Yamato Scientific Co., Ltd., DKN602). Regarding the heating conditions, curing is preferably performed at 100° C. to 200° C. for 10 to 300 minutes (more preferably 20 to 210 minutes). When the temperature is 100° C. or higher, the temporary fixing material is sufficiently cured and a problem is less likely to occur in the subsequent steps, and when the temperature is 200° C. or lower, outgas is less likely to be generated during curing the temporary fixing material and the peeling of the temporary fixing material can be further suppressed. Furthermore, when the heating time is 10 minutes or longer, a problem is less likely to occur in the subsequent steps, and when the curing time is 300 minutes or shorter, working efficiency is less likely to deteriorate. The temporary fixing material layer 2C in FIG. 2(*b*) represents a cured body of the temporary fixing material layer 2A.

<(c) Third Step>

In the third step, a semiconductor chip is mounted on the organic substrate of the laminate that has been subjected to the second step. For example, a semiconductor chip 40 can be packaged on the organic substrate 30 by using a flip-chip bonder (FIG. 2(*c*)). Examples of the packaging apparatus include FC3000L (trade name) manufactured by Toray Engineering Co., Ltd., and the packaging conditions can be optionally selected in accordance with the desired organic substrate and semiconductor chip.

<(d) Fourth Step>

In the fourth step, as illustrated in FIG. 3(*d*), the semiconductor chip 40 mounted on the organic substrate 30 is sealed with a sealing material 50. Examples of the sealing apparatus include FFT1030G (trade name) manufactured by TOWA CORPORATION, and the sealing conditions can be optionally selected in accordance with the desired organic substrate, semiconductor chip, and sealing material. Furthermore, the curing conditions for the sealing material after sealing can be optionally selected according to the type of the sealing material.

<(e) Fifth Step>

In the fifth step, as illustrated in FIG. 3(*e*), the support film 1, the primer layer PL, and the temporary fixing material layer 2C are peeled from the organic substrate 30 of the laminate that has been subjected to the fourth step. Examples of the peeling method include a method in which either of the semiconductor chip-packaged substrate, where a semiconductor chip is mounted on an organic substrate and sealed, and the support film is horizontally fixed and the other one is lifted from the horizontal direction at a certain angle, and a method in which a protective film is pasted to the sealed surface of the semiconductor chip-packaged substrate and the semiconductor chip-packaged substrate and the protective film are peeled from the support film by a peeling method.

These peeling methods are usually performed at room temperature, and may be performed at a temperature of about 40° C. to 100° C.

In the present embodiment, in a case where the temporary fixing material partially remains on the semiconductor chip-packaged substrate, a cleaning step for removing this can be provided. Removal of the temporary fixing material can be performed, for example, by cleaning the semiconductor chip-packaged substrate.

The cleaning liquid is not particularly limited as long as it is a cleaning liquid that can remove the partially remaining temporary fixing material. Examples of such a cleaning liquid include the above-described organic solvent that can be used in dilution of the resin composition for temporary fixing. These organic solvents may be used alone or in combination of two or more kinds thereof.

Furthermore, in a case where it is difficult to remove the remaining temporary fixing material, a base and an acid may be added to the organic solvent. As an example of the base, it is possible to use an amine such as ethanolamine, diethanolamine, triethanolamine, triethylamine, or ammonia; and an ammonium salt such as tetramethylammonium hydroxide. As the acid, it is possible to use an organic acid such as acetic acid, oxalic acid, benzenesulfonic acid, or dodecylbenzenesulfonic acid. The addition amount is preferably 0.01 to 10% by mass as a concentration in the cleaning liquid. Furthermore, an existing surfactant may be added to the cleaning liquid in order to improve the removability of the remained substance.

The cleaning method is not particularly limited, and examples thereof include a method in which cleaning is performed by a paddle using the above-described cleaning liquid, a cleaning method by spraying with a spray, and a method in which a semiconductor wafer is immersed in a cleaning liquid bath. The temperature is suitably 10° C. to 80° C. and preferably 15° C. to 65° C., and the semiconductor chip-packaged substrate is obtained by finally performing water washing or alcohol cleaning and a drying treatment.

In the present embodiment, the semiconductor chip-packaged substrate 55 having a semiconductor chip packaged and sealed thereon is further singularized into semiconductor elements 60 by dicing (FIGS. 4(f) and 4(g)).

FIG. 4(h) is a cross-sectional view schematically illustrating an electronic device 100 produced through the above-described steps. The electronic device 100 has a plurality of semiconductor elements 60 disposed on a wiring board 70 by means of solder balls 65.

The electronic device obtained by the method of the present embodiment can be reduced in thickness, and thus can be suitably used in smartphones, tablet type terminals, and the like.

Hereinabove, embodiments of the present invention have been described, but the present invention is not necessarily limited to the aforementioned embodiments and may be adequately modified within a scope not departing from the gist thereof.

EXAMPLES

Hereinafter, the present invention will be described more specifically by way of Examples and Comparative Example; however, the present invention is not intended to be limited to the following Examples.

[Synthesis of Acrylic Rubber K-1]

In a 500-cc separable flask equipped with a stirrer, a thermometer, a nitrogen purging device (nitrogen inflow tube), and a reflux condenser with a water receptor, 200 g of deionized water, 60 g of butyl acrylate, 10 g of methyl methacrylate, 10 g of 2-hydroxyethyl methacrylate, 20 g of glycidyl methacrylate, 1.94 g of a 1.8% polyvinyl alcohol aqueous solution, 0.2 g of lauryl peroxide, and 0.08 g of n-octylmercaptan were blended. Subsequently, an $N_2$ gas was blown into the flask over 60 minutes to purge air in the system, the temperature in the system was then increased to 65° C., and polymerization was performed for 5 hours. Further, the temperature in the system was increased to 90° C. and stirring was continued for 2 hours, thereby completing the polymerization. The transparent beads obtained by the polymerization reaction were separated by filtration, washed with deionized water, and then dried by a vacuum dryer at 50° C. for 6 hours, thereby obtaining acrylic rubber K-1.

When the weight average molecular weight of the acrylic rubber K-1 was measured by GPC, the weight average molecular weight was 300,000 in terms of polystyrene. Furthermore, the Tg of the acrylic rubber K-1 was −20° C.

[Synthesis of Acrylic Rubber K-2]

In a 500-cc separable flask equipped with a stirrer, a thermometer, a nitrogen purging device (nitrogen inflow tube), and a reflux condenser with a water receptor, 200 g of deionized water, 70 g of butyl acrylate, 10 g of methyl methacrylate, 10 g of 2-hydroxyethyl methacrylate, 10 g of glycidyl methacrylate, 1.94 g of a 1.8% polyvinyl alcohol aqueous solution, 0.2 g of lauryl peroxide, and 0.06 g of n-octylmercaptan were blended. Subsequently, an $N_2$ gas was blown into the flask over 60 minutes to purge air in the system, the temperature in the system was then increased to 65° C., and polymerization was performed for 5 hours. Further, the temperature in the system was increased to 90° C. and stirring was continued for 2 hours, thereby completing the polymerization. The transparent beads obtained by the polymerization reaction were separated by filtration, washed with deionized water, and then dried by a vacuum dryer at 50° C. for 6 hours, thereby obtaining acrylic rubber K-2.

When the weight average molecular weight of the acrylic rubber K-2 was measured by GPC, the weight average molecular weight was 400,000 in terms of polystyrene. Furthermore, the Tg of the acrylic rubber K-2 was −28° C.

[Preparation of Varnish for Forming Temporary Fixing Material Layer]

Preparation Examples 1 and 2

Varnishes for forming a temporary fixing material layer were each prepared at the compositions in parts by mass as shown in Table 1.

TABLE 1

|  |  | Preparation Example 1 | Preparation Example 2 |
|---|---|---|---|
| Thermoplastic resin | Acrylic rubber K-1 | 100 | — |
|  | Acrylic rubber K-2 | — | 100 |
| Thermosetting component | N500P-10 | 20 | 20 |
|  | EXA-830CRP | 10 | 10 |
|  | MEH-7800M | 20 | 20 |
| Silicone compound | TA31-209E | 1 | 1 |
| Curing accelerator | 2PZ-CN | 0.04 | 0.04 |
| Non-volatile component (% by mass) |  | 35 | 35 |
| Solvent: Cyclohexanone |  |  |  |
| Temporary fixing material layer | Shear viscosity (Pa · s) | 6180 | 6000 |
|  | Elastic modulus after heating (MPa) | 342 | 330 |
|  | 5% Weight reduction temperature (° C.) after heating | 204 | 198 |

The details of respective components described in Table 1 are as follows.
(Thermoplastic Resin)
  Acrylic rubber K-1: Acrylic rubber synthesized as described above (weight average molecular weight determined by GPC: 300,000, glycidyl methacrylate: 20% by mass, Tg: −20° C.)
  Acrylic rubber K-2: Acrylic rubber synthesized as described above (weight average molecular weight determined by GPC: 400,000, glycidyl methacrylate: 10% by mass, Tg: −28° C.)
(Thermosetting Component)
  N500P-10: Cresol novolac type polyfunctional epoxy resin (manufactured by DIC Corporation, trade name)
  EXA-830CRP: Bisphenol F type epoxy resin (manufactured by DIC Corporation, trade name)
  MEH-7800M: Phenol novolac resin (manufactured by Meiwa Plastic Industries, Ltd., trade name)

(Silicone Compound)
  TA31-209E: Silicone-modified alkyd resin (manufactured by Hitachi Chemical Co., Ltd., trade name)
(Curing Accelerator)
  2PZ-CN: Imidazole-based curing accelerator (manufactured by SHIKOKU CHEMICALS CORPORATION, trade name)

For the temporary fixing material layer formed from the prepared varnish for forming a temporary fixing material layer, the shear viscosity, the elastic modulus after heating, and the 5% weight reduction temperature after heating were evaluated by the methods described below. The evaluation results are shown in Table 1.

[Measurement of Shear Viscosity]

The shear viscosity was measured by the following procedure. First, four sheets of a temporary fixing material layer having a thickness of 60 μm were laminated at 80° C. to produce a sample for measurement having a thickness of 240 μm. This sample for measurement was heated from 35° C. to 200° C. at a temperature increase rate of 20° C./min while applying 5% strain using a rotating type viscoelasticity measuring apparatus (manufactured by TA Instruments, ARES) set under the following conditions, and the viscosity at the time of reaching 60° C. was measured.
  Measurement method: "parallel plate"
  Measurement jig: Circular jig having a diameter of 8 mm
  Measurement mode: "Dynamic temperature ramp"
  Frequency: 1 Hz

[Measurement of Elastic Modulus after Heating]

The elastic modulus was measured by the following procedure. First, four sheets of a temporary fixing material layer having a thickness of 60 μm were laminated at 80° C. to produce a film having a thickness of 240 μm. This film was heated for 30 minutes in an oven set at 130° C. and further for 1 hour at 170° C. and then was cut in the thickness direction so as to have a width of 4 mm and a length of 33 mm. The cut film was set on a dynamic viscoelasticity apparatus (product name: Rheogel-E4000, manufactured by UMB), a tensile load was applied to the film, the elastic modulus at 25° C. was measured at a frequency of 10 Hz and a temperature increase rate of 3° C./min, and the measured value at 25° C. was recorded.

[5% Weight Reduction Temperature after Heating]

The 5% weight reduction temperature after heating was measured by the following procedure. First, four sheets of a temporary fixing material layer having a thickness of 60 μm were laminated at 80° C. to produce a film having a thickness of 240 μm. This film was heated under predetermined conditions (for example, heated for 30 minutes in an oven set at 130° C. and further for 1 hour at 170° C.), and then 10 mg of the film was cut as a measurement sample. This measurement sample was measured using a differential thermal balance (manufactured by Seiko Instruments Inc., TG/DTA220) at a temperature increase rate of 10° C./min.

[Primer Treatment of Support Film (Primer Layer Formation)]

Treatment Examples 1 to 16

Varnishes for forming a primer layer were each prepared at the compositions (% by mass) as shown in Table 2 or Table 3. Next, each of the prepared varnishes was applied on a support film shown in Table 2 or Table 3, the varnish was dried by heating for 2 minutes at 100° C. to obtain a support film provided with a primer layer.

TABLE 2

| | | Treatment Example 1 | Treatment Example 2 | Treatment Example 3 | Treatment Example 4 | Treatment Example 5 | Treatment Example 6 | Treatment Example 7 | Treatment Example 8 |
|---|---|---|---|---|---|---|---|---|---|
| Support film | | A | A | A | A | A | A | A | A |
| Primer layer | Silane coupling agent A | 10 | 5 | — | — | — | — | — | — |
| | Silane coupling agent B | — | — | — | 10 | — | — | — | — |
| | Polyurethane rubber A | — | 5 | 10 | — | — | — | — | — |
| | Acrylic rubber A | — | — | — | — | 10 | — | — | — |
| | Acrylic rubber B | — | — | — | — | — | 10 | — | — |
| | Acrylic rubber C | — | — | — | — | — | — | 10 | — |
| | Epoxy resin A | — | — | — | — | — | — | — | 10 |
| Non-volatile component (% by mass) | | 10 | 10 | 10 | 10 | 10 | 10 | 10 | 10 |
| Solvent: Cyclohexanone | | | | | | | | | |

TABLE 3

| | | Treatment Example 9 | Treatment Example 10 | Treatment Example 11 | Treatment Example 12 | Treatment Example 13 | Treatment Example 14 | Treatment Example 15 | Treatment Example 16 |
|---|---|---|---|---|---|---|---|---|---|
| Support film | | A | A | A | A | A | A | A | A |
| Primer layer | Silane coupling agent C | 10 | — | — | — | — | — | — | — |
| | Silane coupling agent D | — | 10 | — | — | — | — | — | — |
| | Silane coupling agent E | — | — | 10 | — | — | — | — | — |
| | Acrylic rubber D | — | — | — | 10 | — | — | — | — |
| | Acrylic rubber E | — | — | — | — | 10 | — | — | — |
| | Acrylic rubber F | — | — | — | — | — | 10 | — | — |

TABLE 3-continued

|  | Treatment Example 9 | Treatment Example 10 | Treatment Example 11 | Treatment Example 12 | Treatment Example 13 | Treatment Example 14 | Treatment Example 15 | Treatment Example 16 |
|---|---|---|---|---|---|---|---|---|
| Fluorene-based resin A | — | — | — | — | — | — | 10 | — |
| Silica slurry A | — | — | — | — | — | — | — | 10 |
| Non-volatile component (% by mass) | 10 | 10 | 10 | 10 | 10 | 10 | 10 | 10 |
| Solvent: Cyclohexanone | | | | | | | | |

The details of respective components described in Tables 2 and 3 are as follows.

Silane coupling agent A: 3-Ureidopropyltrialkoxysilane (manufactured by Shin-Etsu Chemical Co., Ltd., product name "KBE585")

Silane coupling agent B: 3-Glycidoxypropyltrimethoxysilane (manufactured by Shin-Etsu Chemical Co., Ltd., product name "KBM403")

Silane coupling agent C: 3-Aminopropyltriethoxysilane (manufactured by Shin-Etsu Chemical Co., Ltd., product name "KBM903")

Silane coupling agent D: 3-Mercaptopropyltrimethoxysilane (manufactured by Shin-Etsu Chemical Co., Ltd., product name "KBM803")

Silane coupling agent E: N-Phenyl-3-aminopropyltrimethoxysilane (manufactured by Shin-Etsu Chemical Co., Ltd., product name "KBM573")

Polyurethane rubber A: Polyurethane rubber (manufactured by DIC Covestro Polymer Ltd., product name "T-8175N")

Acrylic rubber A: Acrylic rubber (manufactured by Nagase ChemteX Corporation, product name "WS-023 EK30", acid value: 20 mgKOH/g, Tg: −10° C., Mw: 500,000)

Acrylic rubber B: Acrylic rubber (manufactured by Nagase ChemteX Corporation, product name "SG708-6", acid value: 9 mgKOH/g, Tg: 4° C., Mw: 700,000)

Acrylic rubber C: Acrylic rubber (manufactured by Nagase ChemteX Corporation, product name "SG-70L", acid value: 5 mgKOH/g, Tg: −13° C., Mw: 900,000)

Acrylic rubber D: Acrylic rubber (manufactured by Nagase ChemteX Corporation, product name "HTR280CHN", acid value: <5 mgKOH/g, Tg: −29° C., Mw: 800,000 to 900,000)

Acrylic rubber E: Acrylic rubber (manufactured by Hitachi Chemical Co., Ltd., product name "KK2", acid value: <5 mgKOH/g, Tg: −20° C., Mw: 250,000)

Acrylic rubber F: Acrylic rubber (manufactured by Hitachi Chemical Co., Ltd., product name "KH-CT865", acid value: <5 mgKOH/g, Tg: 6° C., Mw: 550,000)

Epoxy resin A: Epoxy resin (manufactured by Nagase ChemteX Corporation, product name "EX-810P")

Fluorene-based resin A: Epoxy resin (manufactured by Osaka Gas Chemicals Co., Ltd., product name "SC-001")

Silica slurry A: Silica filler (Admatechs Company Limited, product name "YA050HHG")

Support film A: Polyimide film (manufactured by DU PONT-TORAY CO., LTD., product name "100EN", thickness: 25 µm)

Examples 1 to 11 and Comparative Examples 1 to 10

[Production of Substrate-Conveying Support Tape]

A varnish for forming a temporary fixing material layer shown in Table 4 or Table 5 was applied onto a primer layer of a support film shown in Table 4 or Table 5 and was dried by heating for 5 minutes at 90° C. and for 5 minutes at 120° C. so as to form a temporary fixing material layer having a thickness of 60 µm. Thereafter, a protective film (polyethylene film) was pasted onto the temporary fixing material layer so as to obtain a substrate-conveying support tape having a configuration including the support film, the temporary fixing material layer, and the protective film.

For the substrate-conveying support tapes of Examples and Comparative Examples thus produced, the 90° peel strength after heating was evaluated according to the method described below. The evaluation results are shown in Tables 4 and 5.

[Measurement of 90° Peel Strength after Heating (1)]

The 90° peel strength between the support film and the temporary fixing material layer was evaluated by the following method. The substrate-conveying support tape from which the protective film had been peeled was heated for 30 minutes at 130° C. and subsequently heated for 1 hour at 170° C., and this substrate-conveying support tape was further heated for 5 minutes at 260° C. and then was cut to have a width of 10 mm, thereby obtaining a film for measurement. This film for measurement was subjected to a peel test at a speed of 300 mm/min by a peel tester set to have a peeling angle of 90°, and the peel strength at this time was regarded as the 90° peel strength.

TABLE 4

|  | Example 1 | Example 2 | Example 3 | Example 4 | Example 5 | Example 6 | Example 7 | Example 8 | Example 9 | Example 10 | Example 11 |
|---|---|---|---|---|---|---|---|---|---|---|---|
| Support film | Treatment Example 1 | Treatment Example 2 | Treatment Example 3 | Treatment Example 4 | Treatment Example 5 | Treatment Example 6 | Treatment Example 7 | Treatment Example 8 | Treatment Example 1 | Treatment Example 2 | Treatment Example 3 |
| Temporary fixing material layer | Preparation Example 1 | Preparation Example 1 | Preparation Example 1 | Preparation Example 1 | Preparation Example 1 | Preparation Example 1 | Preparation Example 1 | Preparation Example 1 | Preparation Example 2 | Preparation Example 2 | Preparation Example 2 |

TABLE 4-continued

|  | Example 1 | Example 2 | Example 3 | Example 4 | Example 5 | Example 6 | Example 7 | Example 8 | Example 9 | Example 10 | Example 11 |
|---|---|---|---|---|---|---|---|---|---|---|---|
| 90° Peel strength (N/m) between support film and temporary fixing material layer | 195 | 310 | 342 | 107 | 286 | 78 | 58 | 114 | 209 | 332 | 361 |

TABLE 5

|  | Comparative Example 1 | Comparative Example 2 | Comparative Example 3 | Comparative Example 4 | Comparative Example 5 | Comparative Example 6 | Comparative Example 7 | Comparative Example 8 | Comparative Example 9 | Comparative Example 10 |
|---|---|---|---|---|---|---|---|---|---|---|
| Support film | A | Treatment Example 9 | Treatment Example 10 | Treatment Example 11 | Treatment Example 12 | Treatment Example 13 | Treatment Example 14 | Treatment Example 15 | Treatment Example 16 | A |
| Temporary fixing material layer | Preparation Example 1 | Preparation Example 1 | Preparation Example 1 | Preparation Example 1 | Preparation Example 1 | Preparation Example 1 | Preparation Example 1 | Preparation Example 1 | Preparation Example 1 | Preparation Example 2 |
| 90° Peel strength (N/m) between support film and temporary fixing material layer | 41 | 11 | 18 | 36 | 30 | 17 | 32 | 35 | 12 | 30 |

The details of the support film described in Table 5 are as follows.

Support film A: Untreated polyimide film (manufactured by DU PONT-TORAY CO., LTD., product name "100EN", thickness: 25 μm)

Further, for the substrate-conveying support tapes of Examples 1 and 9 thus produced, the 90° peel strength after heating was evaluated according to the method described below. The evaluation results are shown in Table 6.

[Measurement of 90° Peel Strength after Heating (2)]

The 90° peel strength between the substrate and the temporary fixing material layer was evaluated by the following method. First, a varnish for forming a temporary fixing material layer was applied onto a releasable base film and was dried by heating for 5 minutes at 90° C. and for 5 minutes at 120° C. so as to form a temporary fixing material layer having a thickness of 60 μm, thereby producing a film for transfer. An organic substrate having a surface of a solder resist AUS308 and having a thickness of 200 μm was placed on a stage of a roll laminator (manufactured by Taisei Laminator Co., LTD., VA-400III), the film for transfer was laminated thereon at a temperature of 80° C., a pressure of 0.2 MPa, and a rate of 0.2 m/mins such that the temporary fixing material layer of the film for transfer was pasted to the organic substrate side, and then the releasable base film was peeled. The obtained sample was heated for 30 minutes at 130° C., subsequently heated for 1 hour at 170° C., and then cut to have a width of 10 mm, thereby obtaining a film for measurement. The film for measurement was subjected to a peel test at a speed of 300 mm/min by a peel tester set to have a peeling angle of 90°, and the peel strength at this time was regarded as the 90° peel strength.

[Measurement of 90° Peel Strength after Heating (3)]

The 90° peel strength between the substrate and the temporary fixing material layer was evaluated by the following method. First, a varnish for forming a temporary fixing material layer was applied onto a releasable base film and was dried by heating for 5 minutes at 90° C. and for 5 minutes at 120° C. so as to form a temporary fixing material layer having a thickness of 60 μm, thereby producing a film for transfer. An organic substrate having a surface of a solder resist AUS308 and having a thickness of 200 μm was placed on a stage of a roll laminator (manufactured by Taisei Laminator Co., LTD., VA-400III), the film for transfer was laminated thereon at a temperature of 80° C., a pressure of 0.2 MPa, and a rate of 0.2 m/mins such that the temporary fixing material layer of the film for transfer was pasted to the organic substrate side, and then the releasable base film was peeled. The obtained sample was heated for 30 minutes at 130° C., subsequently heated for 1 hour at 170° C., further heated for 5 minutes at 260° C., and then cut to have a width of 10 mm, thereby obtaining a film for measurement. The film for measurement was subjected to a peel test at a speed of 300 mm/min by a peel tester set to have a peeling angle of 90°, and the peel strength at this time was regarded as the 90° peel strength.

TABLE 6

|  | Example 1 | Example 9 |
|---|---|---|
| Temporary fixing material layer | Preparation Example 1 | Preparation Example 2 |
| 90° Peel strength (N/m) after heating (1) | 85 | 72 |
| 90° Peel strength (N/m) after heating (2) | 86 | 70 |

Since the temporary fixing material layer formed in Preparation Example 1 or 2 has a shear viscosity, which enables the temporary fixing material layer to be sufficiently pasted to the organic substrate at a low temperature, sufficient heat resistance, and an appropriate elastic modulus after heating, the handleability of the thin organic substrate can be improved, and mounting and sealing of a semiconductor chip on the organic substrate can be satisfactorily performed while sufficiently reinforcing the organic substrate. Further, as shown in Table 4, in the substrate-conveying support tapes of Examples 1 to 11, the temporary fixing material layer is provided on the support film having a specific primer layer, and thus the 90° peel strength after heating between the support film and the temporary fixing material layer can be enhanced. Thereby, the pasted support film is easily peeled from the organic substrate so that the temporary fixing material layer does not remain on the organic substrate.

REFERENCE SIGNS LIST

1: support film, 2A, 2C: temporary fixing material layer, 3: protective film, 10: support tape, 15: laminate, 30: organic substrate, 40: semiconductor chip, 50: sealing material, 55: semiconductor chip-packaged substrate, 60: semiconductor element, 65: solder ball, 70: wiring board, 100: electronic device.

The invention claimed is:

1. A substrate-conveying support tape comprising:
a support film;
a primer layer provided on the support film; and
a temporary fixing material layer provided on the primer layer, wherein
the support film is a polyimide film,
the temporary fixing material layer comprises a thermoplastic resin, and
the primer layer consists of at least one selected from the group consisting of a silane coupling agent having an epoxy group or a ureido group, an epoxy resin, a polyurethane rubber, and an acrylic rubber having an acid value of 5 mgKOH/g or more, wherein, when a laminate which is formed by affixing the substrate-conveying support tape to a substrate having a mean surface provided with a solder resist so that the temporary fixing material layer is in contact with the main surface of the substrate and which comprises the substrate, the temporary fixing material layer, the primer layer, and the support film in this order, is heated for 30 minutes at 130° C. for 1 hour at 170° C. and for 5 min at 260° C., a 90° peel strength at 25° C. between the temporary fixing material layer and the support film in the laminate is larger than a 90° peel strength at 25° C. between the substrate and the temporary fixing material layer in the laminate.

2. The substrate-conveying support tape according to claim 1, wherein the primer layer consists of the acrylic, wherein the acrylic rubber has a glass transition temperature of 5° C. or lower.

3. The substrate-conveying support tape according to claim 1, wherein the temporary fixing material layer further comprises a thermosetting resin.

4. The substrate-conveying support tape according to claim 1, wherein the 90° peel strength between the substrate and the temporary fixing material layer is 30 N/m or more and 300 N/m or less.

5. The substrate-conveying support tape according to claim 1, wherein the substrate-conveying support tape is configured to convey a coreless substrate.

6. A method for producing an electronic apparatus, the method comprising:

forming a laminate including the substrate-conveying support tape according to claim 1 and an organic substrate having a thickness of 10 to 1000 μm such that the temporary fixing material layer is in contact with the organic substrate in the laminate;
heating the temporary fixing material layer of the laminate;
mounting a semiconductor chip on the organic substrate of the laminate after heating the temporary fixing material layer;
sealing the semiconductor chip mounted on the organic substrate with a sealing material; and
peeling off the support film, the primer layer, and the temporary fixing material layer from the organic substrate of the laminate after sealing the semiconductor chip.

7. The method according to claim 6, wherein the organic substrate is a coreless substrate.

8. The method according to claim 6, wherein the organic substrate has a thickness of 200 μm or less.

9. The method for producing an electronic apparatus according to claim 6, wherein the acrylic rubber has a glass transition temperature of 5° C. or lower.

10. The method for producing an electronic apparatus according to claim 6, wherein the temporary fixing material layer further comprises a thermosetting resin.

11. A laminate comprising the substrate-conveying support tape according to claim 1, wherein
the laminate is formed by affixing the substrate-conveying support tape to a substrate having a main surface provided with a solder resist so that the temporary fixing material layer is in contact with the main surface of the substrate and which comprises the substrate, the temporary fixing material layer, the primer layer, and the support film in this order, and wherein
the laminate has a 90° peel strength at 25° C. between the temporary fixing material layer and the support film larger than a 90° peel strength at 25° C. between the substrate and the temporary fixing material layer after heating the laminate for 30 minutes at 130° C. for 1 hour at 170° C. and for 5 minutes at 260° C.

12. The laminate according to claim 11, wherein the 90° peel strength of the laminate between the substrate and the temporary fixing material layer is 30 N/m or more and 300 N/m or less.

13. The substrate-conveying support tape according to claim 1, wherein the temporary fixing material layer further comprises a silicone compound.

14. The substrate-conveying support tape according to claim 1, wherein the primer layer consists of the silane coupling agent.

15. The substrate-conveying support tape according to claim 1, wherein the primer layer consists of the epoxy resin.

16. The substrate-conveying support tape according to claim 1, wherein the primer layer consists of the polyurethane rubber.

* * * * *